United States Patent
Hsu et al.

(10) Patent No.: US 7,604,909 B2
(45) Date of Patent: Oct. 20, 2009

(54) METHOD FOR IMPROVED MANUFACTURABILITY AND PATTERNING OF SUB-WAVELENGTH CONTACT HOLE MASK

(75) Inventors: Chung-Wei Hsu, Taipei (TW); Douglas Van Den Broeke, Sunnyvale, CA (US); Jang Fung Chen, Cupertino, CA (US)

(73) Assignee: ASML Masktools B.V. (NL)

( * ) Notice: Subject to any disclaimer, the term of this patent is extended or adjusted under 35 U.S.C. 154(b) by 284 days.

(21) Appl. No.: 11/647,599

(22) Filed: Dec. 29, 2006

(65) Prior Publication Data

US 2008/0014509 A1    Jan. 17, 2008

Related U.S. Application Data

(60) Provisional application No. 60/754,311, filed on Dec. 29, 2005.

(51) Int. Cl.
*G03F 1/00* (2006.01)
*G03F 5/00* (2006.01)
(52) U.S. Cl. .................................... 430/5; 430/311

(58) Field of Classification Search .................... 430/5, 430/394, 311; 716/19, 20, 21; 438/725
See application file for complete search history.

(56) References Cited

U.S. PATENT DOCUMENTS 7,093,228 B2 *    8/2006   Andreev et al. ............... 716/21

FOREIGN PATENT DOCUMENTS

EP           1513012 A2 *   3/2005

* cited by examiner

*Primary Examiner*—Stephen Rosasco
(74) *Attorney, Agent, or Firm*—Pillsbury Winthrop Shaw Pittman LLP

(57) ABSTRACT

A method of applying optical proximity correction features to a mask having a target pattern comprising a plurality of features to be imaged. The method includes the steps of defining a set of process parameters to be utilized to image the mask; determining an interference map based on the process parameters and the target pattern; defining an area of influence which represents the area about a given feature in the target pattern in which scattering bars will be utilized in the mask; and disposing a scattering bar in the mask adjacent the given feature in a location indicated by said interference map only within the area of influence of the given feature.

25 Claims, 11 Drawing Sheets

Binary Fresnel Lens

PSF

Position (μm)

CPL Fresnel Lens

Improvement methodology

1. Reduce SB figure count depending on influence range & strength

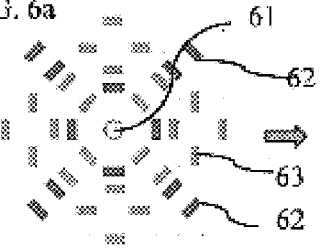
FIG. 6a
Original mask layout
(SB count 36)

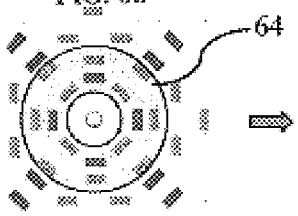
FIG. 6b
Strong influence range

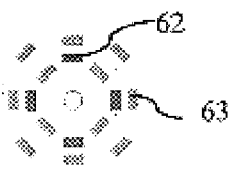
FIG. 6c
Remove the SB outside the influence range
(SB count 16)

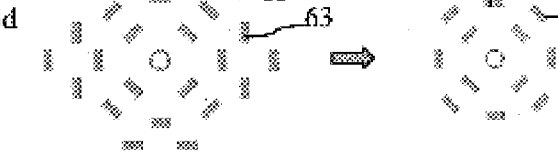
FIG. 6d
The zero phase has stronger influence on image
(SB count 26)

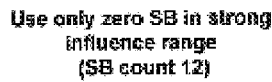
FIG. 6e
Use only zero SB in strong influence range
(SB count 12)

Improvement methodology

2. Use uniform or specific angle (orthogonal, or 45 degree)

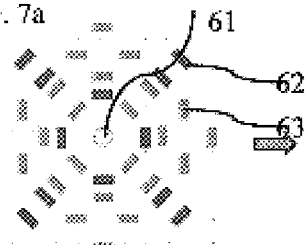
FIG. 7a
Original mask layout
(SB count 36)

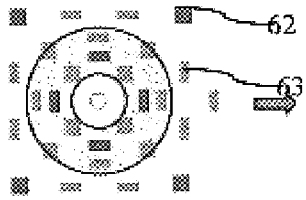
FIG. 7b
Orthogonal SB in strong influence range

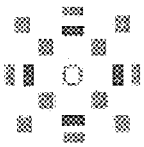
FIG. 7c
Remove orthogonal SB outside the influence range
(SB count 16)

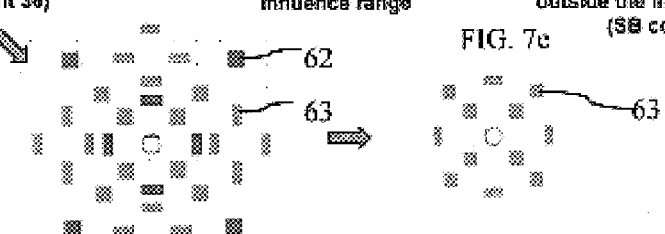
FIG. 7d
Orthogonal SB only no 45 degree

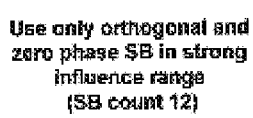
FIG. 7e
Use only orthogonal and zero phase SB in strong influence range
(SB count 12)

Simplification with annular illumination – reduce complexity of the mask pattern

- Make all "scattering bar" features the same size and shape
- Apply only pi phase scatter bar features

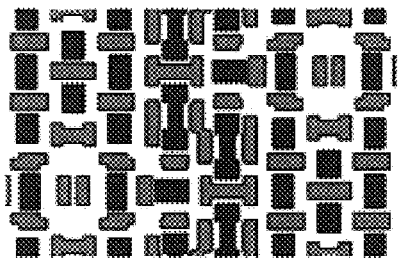

Non-simplified mask pattern base on IML.

FIG. 12a

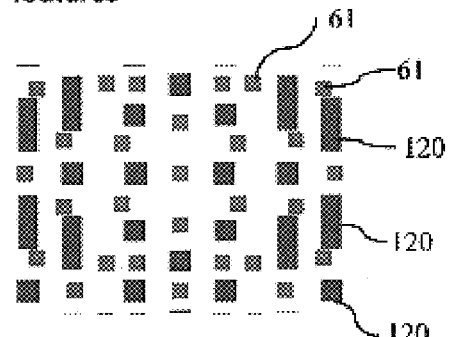

Simplified mask pattern based on IML

FIG. 12b

IML Simplification with Other Illuminations

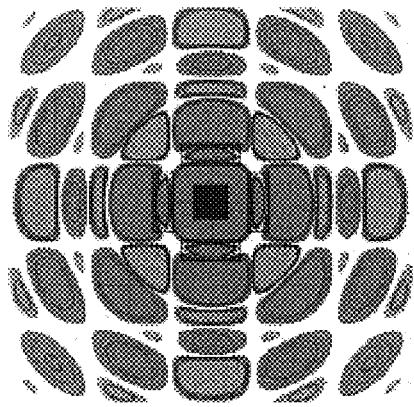

Isolated contact interference map – 0.85NA, .93/.68/30deg quasar illumination

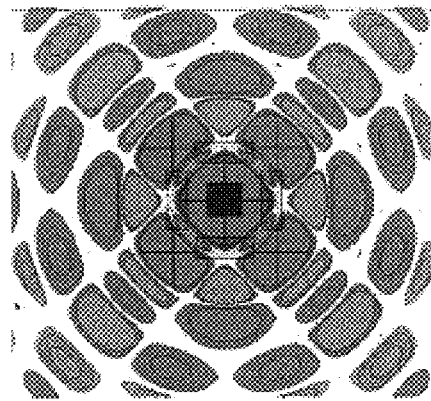

Isolated contact interference map – 0.85NA, .93/.68/30deg cquad illumination

- With other illuminations (i.e. custom illuminations), the ideal phase for the background is no longer zero everywhere
- Chrome shielding (zero transmission) can be applied in background areas where ideal phase is pi.

FIG. 13a      FIG. 13b

METHOD FOR IMPROVED MANUFACTURABILITY AND PATTERNING OF SUB-WAVELENGTH CONTACT HOLE MASK

CLAIM OF PRIORITY

This patent application, and any patent(s) issuing therefrom, claims priority from U.S. provisional patent application No. 60/754,311, filed on Dec. 29, 2005, entitled "Method Of Improved Manufacturability For Patterning Sub-Wavelength CH Mask", which is incorporated herein by reference in its entirety.

FIELD OF THE INVENTION

The present invention relates to photolithography, and in particular relates to a method of generating and printing contact hole masks, which utilizes an improved method for applying optical proximity correction features to mask layouts utilizing an interference map. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths.

One well known technique for improving the resolution performance of current imaging tools is the use of OPC techniques, which include the use of subresolution assist features, also known as scattering bars (SBs), within the mask design. For example, U.S. patent application Ser. No. 10/756,829 filed on Jan. 14, 2004; Ser. No. 10/756,830 filed on Jan. 14, 2004, and Ser. No. 10/878,490 filed Jun. 29, 2004, all of which are assigned to the assignee of the instant application, and all of which are incorporated herein by reference in their entirety, disclose a concept of placing SBs and non-printable phase features in the mask design utilizing interference maps (IM). While the concept has been demonstrated feasible for manufacturing purposes, it can still be a challenging process to apply the concepts into a manufacturing worthy implementation, especially when dealing with complex mask designs.

One such complex mask which is of particular interest is a contact hole mask. Currently there are two well-known resolution enhancement practices when comes to the printing of contact hole (CH) mask patterns with hole dimensions that are less than the exposure wavelength ($\lambda$). The most common one is to use predefined rules to bias the contact hole feature on a 6% attenuated phase-shifting mask, which allows the enlarged CH feature to become more printable. This process works sufficiently well for patterning a CH mask with hole dimensions at near or slightly below exposure wavelength.

In order to print yet smaller dimension of contact holes, approaching one-half of the exposure wavelength, the second practice is to add scattering bars around the CH feature in question. The use of SBs enhances the slope of the CH aerial images and thereby achieves a better depth of focus. The placement of SBs in the neighborhood of main CH feature also helps improve the peak intensity level of the main CH feature, thus resulting in better printability. For more uniformed printing for the entire CH mask, it maybe necessary to apply both the feature biasing schemes and SBs at the same time.

The feature "biasing" scheme can be based on either a rule-based optical proximity correction (OPC) or model-based OPC method. The SB application can also be performed either using a rule-based or model-based method. When utilizing a rule-based method, the SB placement and size must be first "manually determined" for as many contact feature pitch ranges as possible. However, in actual practice, it is typically not possible to have enough rules for all random CH pattern conditions for a real IC design. It has been acceptable to utilize a limited set of SB rules together with model-based OPC scheme for the printing of CH dimensions at slightly below the exposure wavelength. However, such a scheme is not trouble free when printing a CH pattern at one-half or smaller of the exposure wavelength. The use of model SB is considered to be much more adequate to reduce the imaging "weak spot" for the entire exposure field.

As noted above, it is known to use interference mapping as a basis for model SB application. FIGS. 1a-1d illustrates an example of the generation of an interference map for an isolated contact illuminated using Quasar™ illumination, which can be generated using either an empirical method or a simulation method as detailed in U.S. patent application Ser. No. 10/756,829 filed on Jan. 14, 2004; Ser. No. 10/756,830 filed on Jan. 14, 2004, and Ser. No. 10/878,490 filed Jun. 29, 2004, all of which are incorporated herein by reference in their entirety. FIG. 1a and 1b illustrate an exemplary binary fresnel lens and CPL fresnel lens, respectively, which correspond to utilizing a binary mask and a chromeless-phase-lithography (CPL) mask, respectively. FIG. 1c illustrates the image intensity utilizing a point spread function (PSF) associated with the isolated contact. In the case of an isolated contact, the interference map is directly proportional to the PSF. FIG. 1d illustrates an exemplary interference map associated with the isolated contact.

As is known, it is possible to identify areas of constructive and destructive interference with respect to the imaging of the given feature with an interference map. Once these areas are identified, scattering bars having the proper phase assigned relative to the main feature, can be placed in the mask design to constructively enhance the printing of the main feature. Referring to FIG. 1d, the yellow and red regions 12 in the interference map represent areas where the zero phase light has the strongest positive affect on the contact imaging. The blue regions 14 represent areas where $\pi$-phase shifted light has the strongest positive affect on the contact imaging, and the black regions 16 represent areas where neither $\pi$-phase shifted light nor zero phase light have a positive affect on contact imaging.

FIG. 2 is an example of interference map generated for a random 2D IC layout. The green areas 17 in FIG. 2 correspond to the areas in which n-phase shift light enhances imaging of the contact hole and the orange areas 19 correspond to the areas in which zero phase shift light enhances imaging of the contact hole. FIG. 3 shows the placement of SBs based on the IM of FIG. 2. As shown, SBs having a x-phase shift are placed in the green areas 17 of the IM and SBs having a zero phase shift are placed in the orange areas 19 of the IM. However, when utilizing this IM technique in combination with the model-based technique, the number of SBs to be placed in the mask can be increased by at least one to two orders of magnitude, thereby resulting in a significant increase in pattern complexity, as is shown in FIG. 4. It is an objective of this invention to provide a method for applying SBs which allows for the benefits of the foregoing technique but which reduces the SB count and the overall complexity of the mask design.

Another issue associated with imaging contact hole patterns for very low k1, where k1=(numerical aperture, NA, of the exposure tool)*(minimum half pitch of CH mask pattern)/(exposure wavelength, $\lambda$), there is typically no room to insert SB between the contact holes. Without the ability to shrink the exposure wavelength, the printability is mostly governed by the NA of the exposure tool. Due to the two dimensional nature of contact hole features, it is more challenging to print low k1 factor contact holes as compared to the printing of one-dimensional line and space patterns. Looking beyond 45 nm IC technology node, it is very likely that the industry will stay with 193 nm immersion for IC manufacturing. The NA for the exposure tool can be made close to 1.4 for water-based immersion. However, the relative low k1 factor issue remains for the printing of two-dimensional contact holes at 32 nm node. Splitting a densely packed contact mask pattern into two or more isolated exposure masks is one logical option for addressing the foregoing issue.

When a contact hole mask is decomposed into two less dense mask patterns, the k1 can be relaxed by as much as a factor of 2. This will allow the use of IM generated SBs along with model-based OPC to achieve the desire printing quality for each mask exposure. The overall printing capability is dependent on the outcome of the double exposure.

There are basically two patterning methods for pitch-decomposed contact hole masks. One is to print the first decomposed mask and then perform the develop and etch process. The first exposure is then unloaded from the wafer chuck of the exposure tool for subsequent processing before it is ready to be re-loaded for the second exposure. With this method, there is no correlation in terms of imaging between the first and second patterning. The imaging process can take a full advantage of high k1 factor except for a stringent alignment requirement since the wafer has left the chuck between the two exposures. With a develop and etch process in between the two patterning exposures, more process related complications can be expected. This method is referred to as double patterning (DP).

The other method is to leave the wafer on the chuck after the first mask exposure, and then re-expose it with the second mask. This method is feasible with a dark field mask since the first exposure does not affect the "dark area" of the first mask and vice versa for the second exposure mask. This exposure technique is referred to as double exposure (DE), and is relatively easier since it does not involve any of the subsequent wafer processing steps between the two exposures. Further, the alignment accuracy requirement between the two mask exposures is straightforward compared to the DP technique because the wafer never leaves the exposure chuck. The main challenge for the DE technique concerns how to "protect" the un-exposed areas in each exposure while ensuring the best printability for the intended patterning areas. This is particularly challenging because SBs are utilized in the unexposed areas. It is a second objective of the present invention to address this issue.

SUMMARY OF THE INVENTION

In an effort to solve the foregoing needs, it an object of the present invention to provide a method for efficiently processing the complexity of IM generated model SBs, while ensuring the robustness of model placement for a random CH layout. It is another object of the present invention to provide a method of effectively protecting the un-exposed areas in a DE technique while ensuring, for each exposure, the best printability for the intended patterning areas.

More specifically, the present invention relates to a method of applying optical proximity correction features to a mask having a target pattern comprising a plurality of features to be imaged. The method includes the steps of defining a set of process parameters to be utilized to image the mask; determining an interference map based on the process parameters and the target pattern; defining an area of influence which represents the area about a given feature in the target pattern in which scattering bars will be utilized in the mask; and disposing a scattering bar in the mask adjacent the given feature in a location indicated by said interference map only within the area of influence of the given feature.

In addition, the present invention relates to a computer program product for controlling a computer comprising a recording medium readable by the computer, means recorded on the recording medium for directing the computer to generate files corresponding to a mask having a target pattern including a plurality of features to be imaged and optical proximity correction features, where the generation of the files includes the steps of defining a set of process parameters to be utilized to image the mask; determining an interference map based on the process parameters and the target pattern; defining an area of influence which represents the area about a given feature in the target pattern in which scattering bars will be utilized in the mask; and disposing a scattering bar in the mask adjacent the given feature in a location indicated by said interference map only within the area of influence of the given feature.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, the present invention provides a method for applying SBs which allows for the benefits associated with IM but which reduces the SB count and the overall complexity of the mask design.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIGS. 6a-6e illustrate a first example of the application of the method of the present invention.

FIGS. 7a-7e illustrate a second example of the application of the method of the present invention.

FIGS. 8a-8e illustrate a third example of the application of the method of the present invention.

FIG. 12a illustrates an example of a non-simplified mask pattern developed based on an IM, and FIG. 12b illustrates the simplified mask pattern generated by performing the method of the present invention.

FIGS. 13a and 13b illustrate exemplary IMs associated with different illuminations and how the location of SBs can be manipulated in accordance with the present invention using different illuminations.

DETAILED DESCRIPTION OF THE INVENTION

Figure 1A:
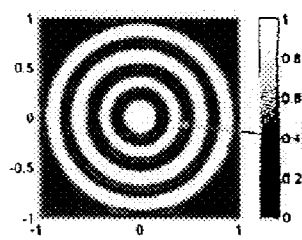
FIGS. 1a-1d illustrate an example of the generation of an interference map for an isolated contact.
Figure 1C:
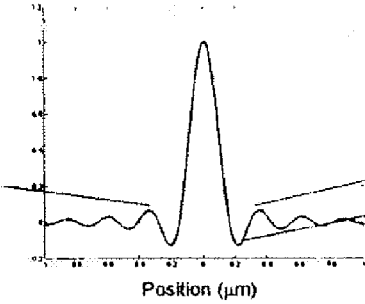
Figure 1B:
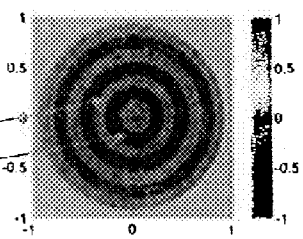
Figure 1D:
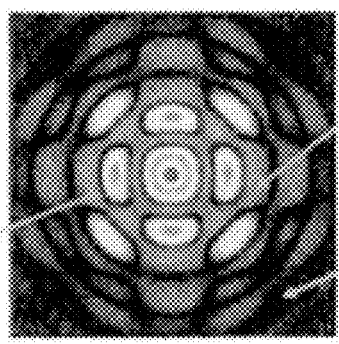
Figure 2:
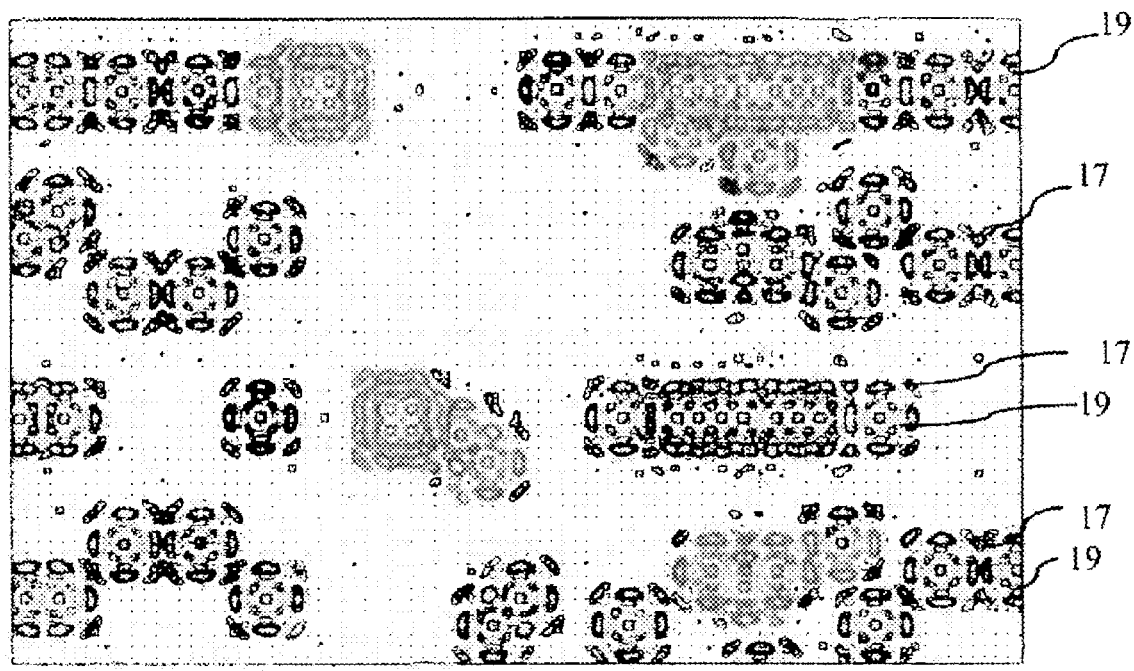
FIG. 2 is an example of interference map generated for a random 2D IC layout.
Figure 3:
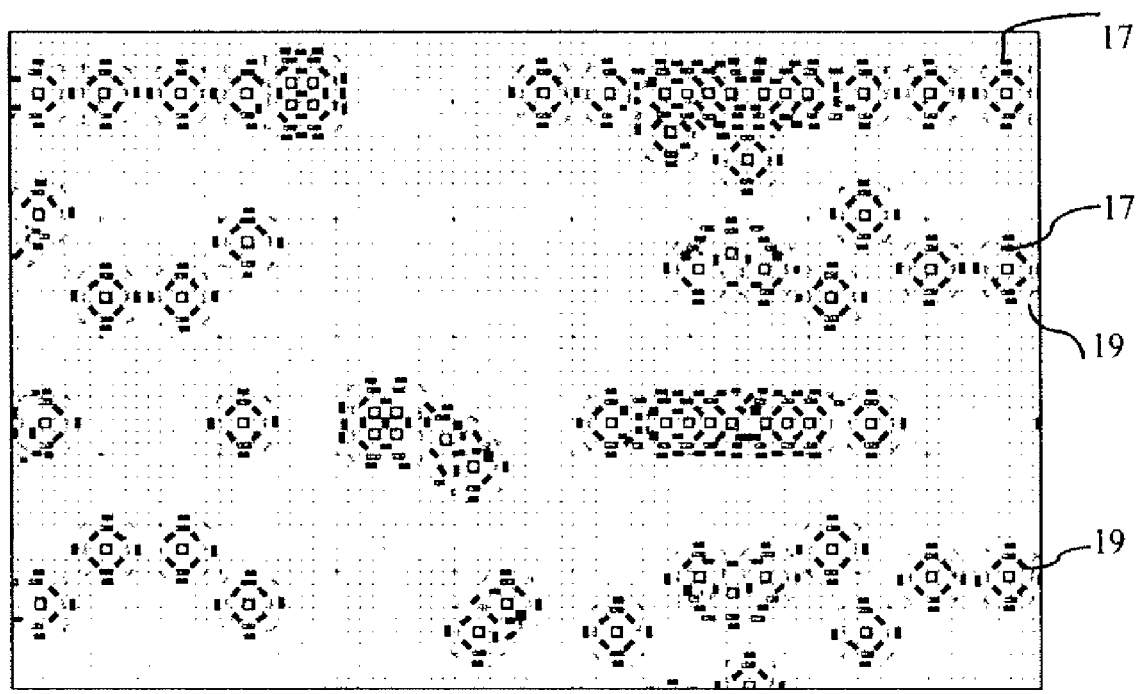
FIG. 3 illustrates an exemplary placement of SBs based on the IM of FIG. 2.
Figure 4:
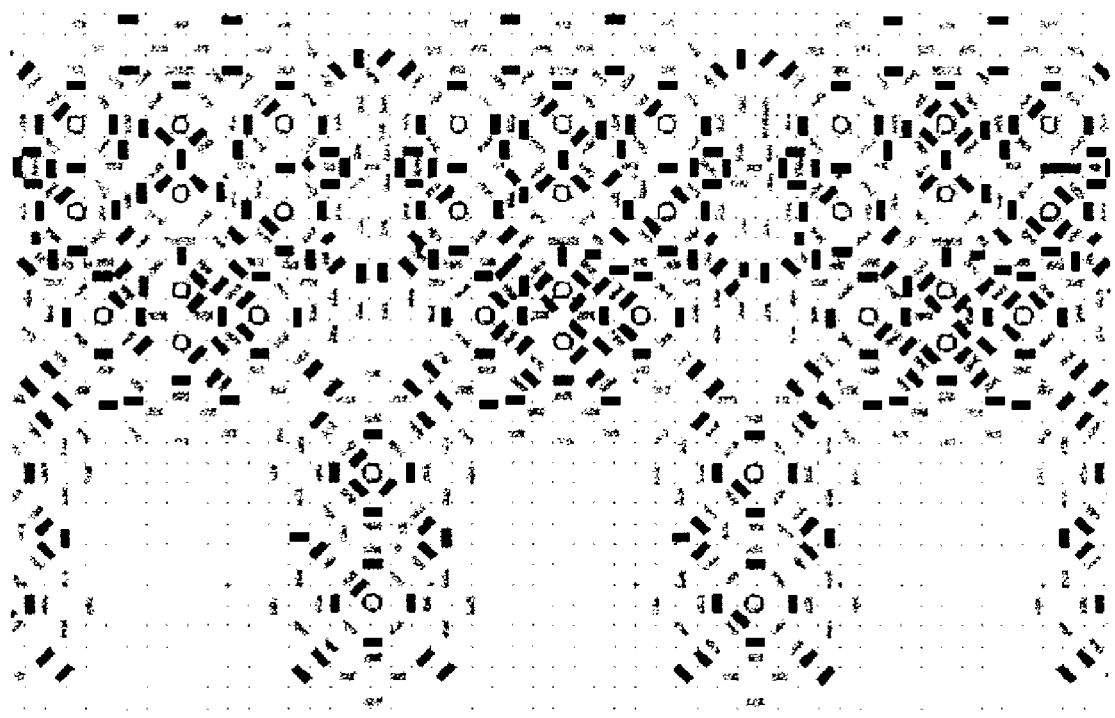
FIG. 4 illustrates an exemplary placement of SBs utilizing the SB placement of FIG. 3 in combination with a model-based OPC technique.

As noted above, a first embodiment of the present invention provides a method of applying SBs to a mask pattern (e.g., a random contact hole pattern) that prevents the generation of an overly complex mask pattern and minimizes the overall feature count of the mask to be imaged. More specifically, the method of the first embodiment entails establishing an "area of influence" around the main CH pattern and then placing SBs only in the "area of influence". The positions of the SBs to be placed around the contact holes are defined utilizing an interference mapping technique, such as those noted above. The "area of influence" represents the area about the contact hole in which if SBs are placed, the SBs strongly influence the imaging of the given contact hole. By limiting the area in which SBs are placed around a given contact hole to a predetermined "area of influence", the number of SBs contained in the mask design is significantly reduced. The size of the "area of influence" is dependent on the given process and the given design rules, and can be predefined, for example by an operator. Typically, the "area of influence" can be based on a factor of (λ/NA). Further, it is noted that the "area of influence" can also be determined automatically utilizing a simulation process to determine the "area of influence" necessary to obtain acceptable imaging results. In such a case, the simulation may start with the small "area of influence" and execute a simulation utilizing only the SBs within the "area of influence" as indicated by the IM to determine the resulting aerial image. If the resulting image is not acceptable, the "area of influence" can be expanded to include additional SBs and then the simulation is re-executed. This process is continued until an acceptable "area of influence" is identified.

Once the "area of influence" is defined, the SBs as defined by the interference map that fall outside of the "areas of influence" are eliminated and not included in the mask design. Such omitted SBs have a relatively small impact on the overall imaging process. Further, this negative impact caused by the omission of the SBs outside the "area of influence" is adequately compensated for by applying standard model-based OPC to the mask design. Thus, as is clear from the foregoing, for a larger "area of influence", the more SBs will be included in the mask design, and therefore, a more complex SB pattern will result in the final mask pattern. For a smaller "area of influence", the resulting mask pattern will have less SBs, and therefore the resulting mask pattern will be less complex, but may require an additional model-based OPC treatment to compensate and achieve an acceptable imaging result.

In a second embodiment of the present invention, once the "area of influence" is defined and the SBs inside the "area of influence" are identified, the feature count of the mask design can be further reduced by performing the process of connecting neighboring SBs, wherever feasible to further reduce the feature count. When performing this process, it is necessary to have rules and processes in place that would check and verify that any "connected" SBs remain sub-resolution. Whether or not a given SB or "connected" SB will be sub-resolution depends and varies in accordance with the given illumination process. As such, typically the rules associated with the largest acceptable SB, so that the SB remains sub-resolution, are defined by the operator. Thus, this step attempts to combine as many adjacent SBs as possible, while ensuring that none of the "combined" or "connected" SBs will be imaged during the printing process. It is noted, however, when connecting the SBs, it is necessary to avoid right angle connections between SBs, because right angle connections can readily cause un-wanted printing residues. Alternatively, if simply extending an SB, it is necessary to avoid corner touching to minimize mask formation complications.

Once the two process steps of the first and second embodiment discussed above are performed, in another variation of the present invention, a model-based OPC process is performed on the mask design. Any of the known model-based OPC techniques, for example, such as described in U.S. patent application Ser. No. 10/981,750 filed on Nov. 5, 2004, which is hereby incorporated by reference in its entirety, may be utilized to perform the OPC process to the mask design.

As another variation to the foregoing, it is also possible to perform manufacturing reliability verification to ensure there is no printing errors or residues on the mask design formed utilizing the foregoing process. Any standard manufacturing reliability verification process may be utilized.

In yet another variation, the number of SBs contained in the design can be further reduced by eliminating all π-phase SB features and keeping only 0-phase SB features or vice versa. Thus, once the SBs contained with the "area of influence" are defined, only π-phase SB features or 0-phase SB features are inserted into the mask design at the appropriate location as defined by the IM. It is noted that technique is more compatible with attPSM with adequate percent transmission. It is also noted that in another variation, the SB count can be further limited by eliminating SBs based on orientation. For example, all 45 degree SBs can be eliminated from the mask design, and only SBs parallel or orthogonal to the CH are included in the mask design. Of course, it also possible to select only the 45 degree SBs and omit all other SBs from the design. Alternatively, it is also possible to modify the shape of the SBs indicated to be required by the IM so as to facilitate manufacturing of the mask design (e.g., 45 degree SBs can be formed as squares so as to be orthogonal to the feature).

Figure 5:
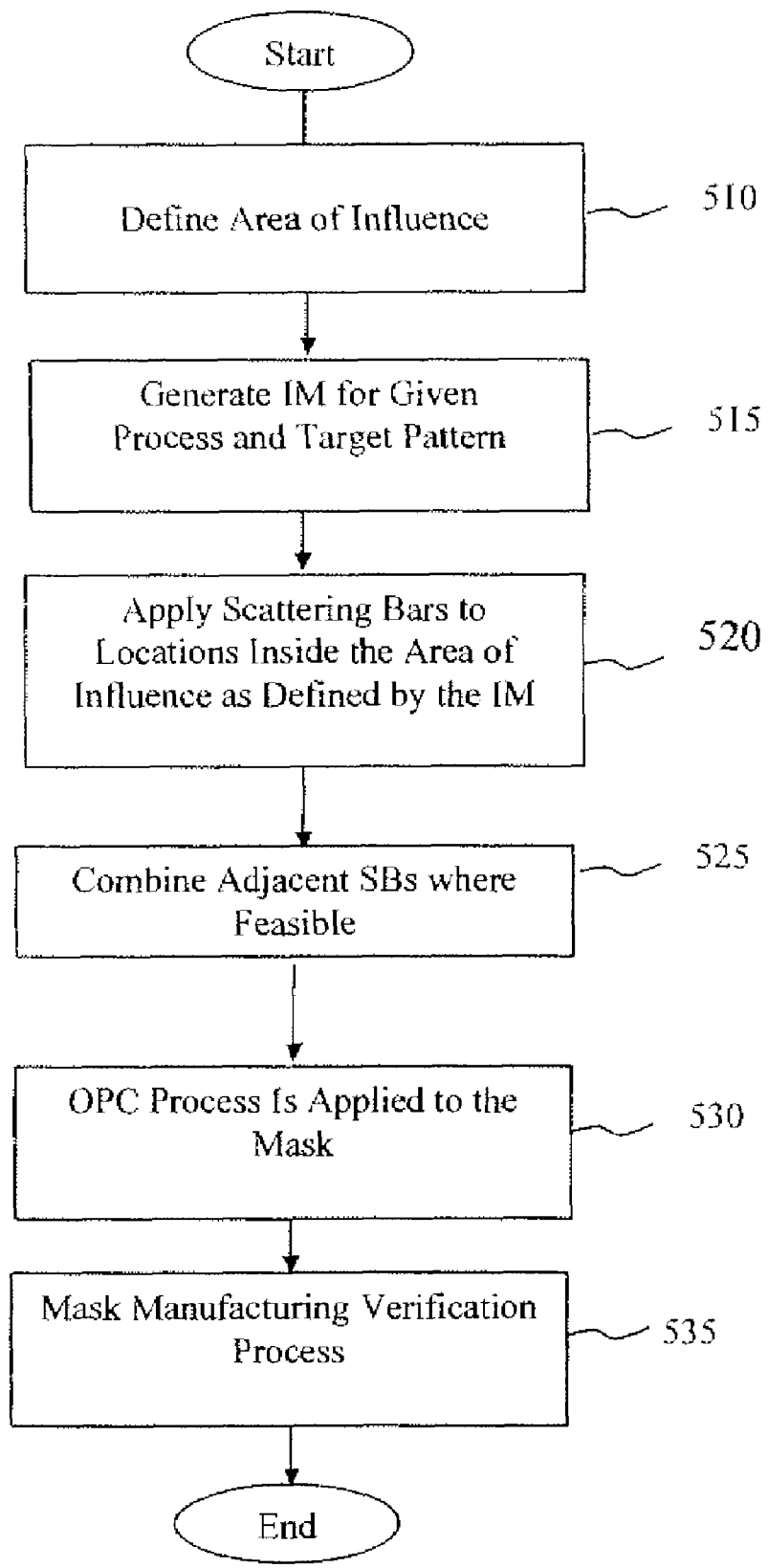
FIG. 5 illustrates an exemplary flowchart of the process of the first embodiment of the present invention.

FIG. 5 illustrates an exemplary flowchart depicting the foregoing process. Referring to FIG. 5, the first step 510 in the process is defining the "area of influence" for the given process, which is typically based on a factor of (λ/NA). The next step 515 is to generate an interference map IM for the given process and target pattern. Once the IM is generated, in the next step 520, only SB locations inside the "area of influence" for a given CH have SBs applied to the target mask pattern as indicated by the IM. Next, in step 525, adjacent SBs are connected wherever feasible so as to reduce the SB count. Next, an OPC process, for example, a model-based OPC process is applied to the mask design in step 530. Once step 530 is complete, the mask design is subjected to a manufacturing reliability verification process, utilizing, for example, a calibrated OPC model, so as to ensure the mask design is manufacturable (step 535). If the mask design passes the verification process, the mask design is complete and can be utilized in the imaging process. If the mask design fails the verification process, the operate reviews the reasons for failure, and performs adjustments to the design so as to remedy the failure. Of course, such revision of the mask design can also be performed automatically utilizing appropriate mask correction software.

FIGS. 6a-9 illustrate various aspects of the foregoing processes. Referring to figures, FIG. 6a illustrates the original SB layout based on the IM for a single contact hole, with the green SBs 62 having a π-phase shift and the orange SBs 63 having a zero phase shift. FIG. 6b illustrates the "area of influence" 64, which in the given embodiment represents a circle having a defined radius with the center of the circle being located at the CH 61. FIG. 6c illustrates the SBs outside of the "area of influence" being removed from the mask design. FIG. 6d represents a variation in which only SBs 63 having 0-phase shift are included in the mask design. FIG. 6e illustrates the result of the "area of influence" being applied to the mask of FIG. 6d. It is noted that either the 0-phase SBs or the π-phase SBs are to be eliminated, it is preferable to include the phase of SBs having the greater affect on the resulting image, which can be determined using, for example, the IM.

FIG. 7a illustrates the same SB layout based on the IM for a single CH as shown in FIG. 6a. FIG. 7b illustrates the application of the "area of influence" 64 in combination with utilizing only SBs positioned orthogonal to the CH. FIG. 7c illustrates the resulting mask design. As shown by FIGS. 7b and 7c, the SBs that are positioned at a 45 degree angle to the CH in FIG. 7a have been formed so as to have a shape (e.g., square) which is orthogonal to the feature. Similar to FIGS. 6d and 6e, FIG. 7d represents a variation in which only SBs 63 having 0-phase shift are included in the mask design. FIG. 7e illustrates the result of the "area of influence" being applied to the mask of FIG. 7d.

FIG. 8a illustrates the same SB layout based on the IM for a single CH as shown in FIG. 6a. FIG. 8b illustrates the application of the "area of influence" in combination with the process of connecting adjacent SBs to reduce overall feature count. FIG. 8c illustrates the resulting mask design. As shown by FIGS. 8b and 8c, a number of zero-phase SBs 63 can be connected together, as these SBs are not separated by any π-phase SBs. The rules governing whether adjacent SBs can be connected together will vary with the given process being utilized. Once again, similar to FIGS. 6d and 6e, FIG. 8d represents a variation in which only SBs 63 having 0-phase shift are included in the mask design. FIG. 8e illustrates the result of the "area of influence" being applied to the mask of FIG. 8d.

Figure 9:
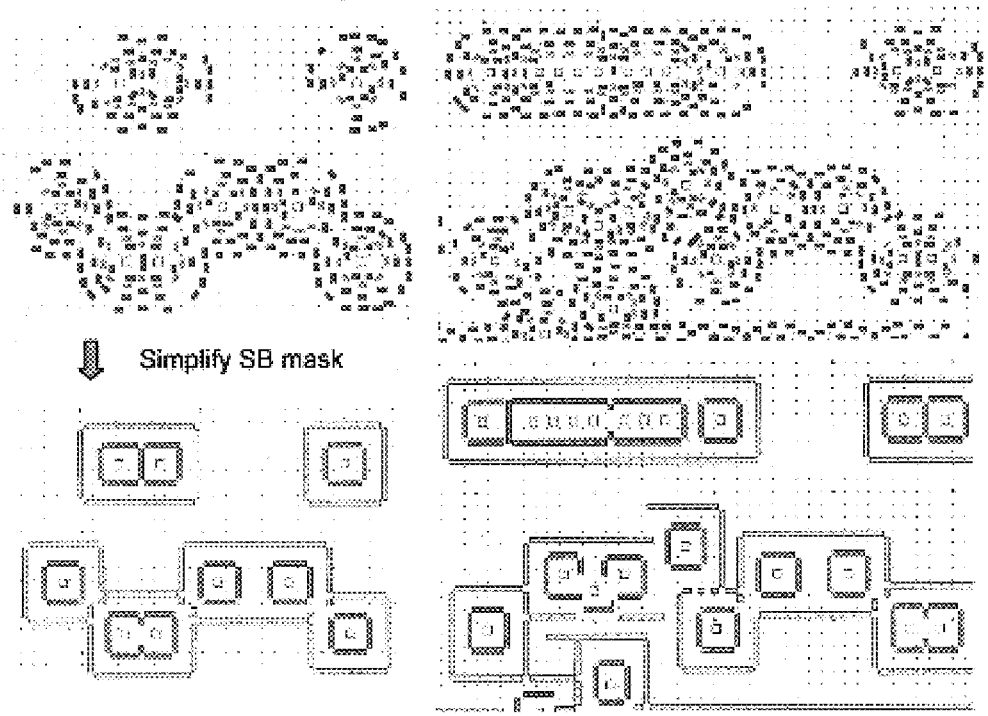
FIG. 9 illustrates an example of a portion of a full chip logic design and the resulting mask as formed utilizing the method of the present invention.

Finally, FIG. 9 illustrates an example of a portion of a full chip logic design and the resulting mask as formed utilizing the foregoing process. As is clearly shown in FIG. 9, the resulting mask design is significantly simpler than the mask having SBs applied based solely on the IM.

Figure 10:
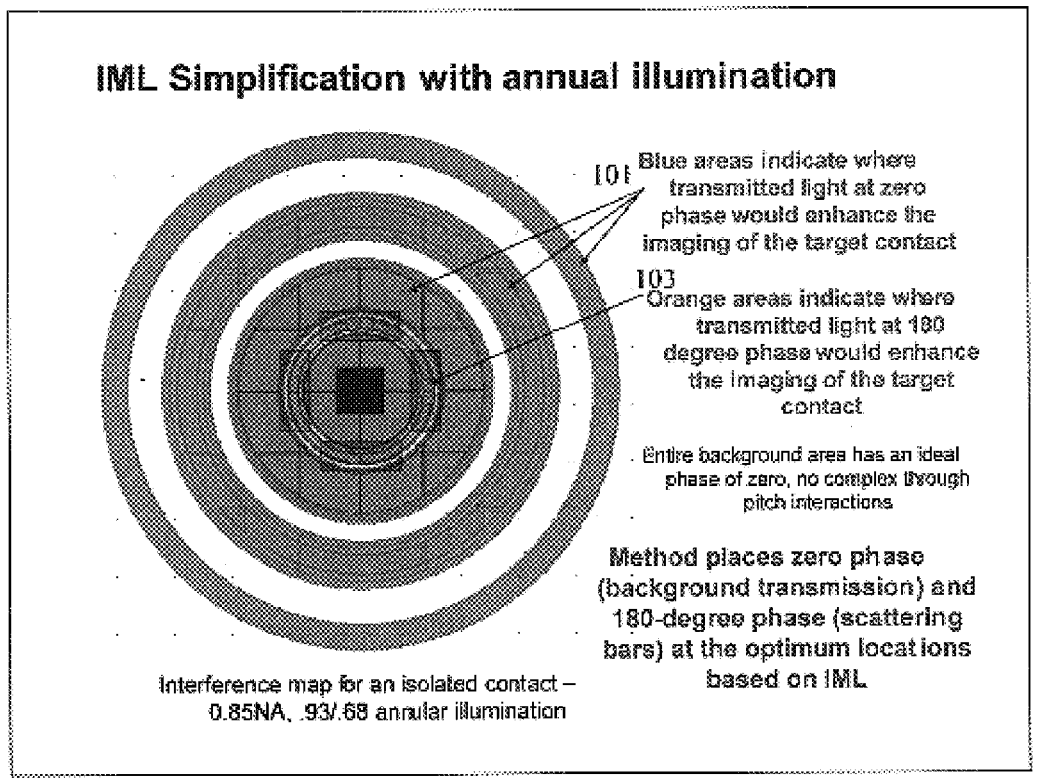
FIG. 10 illustrates an exemplary interference map for an isolated contact hole utilizing annular illumination.

In accordance with a third embodiment of the present invention, the illumination to be utilized in the given process is considered when determining SB placement in the mask design to determine the most effective SB to utilize for the given process. For example, referring to FIG. 10, in a process utilizing annular illumination, an IM is generated for an isolated contact hole, and the IM indicates that the most effective SB for the given process are π-phase shifted SBs, because the π-phase shifted SBs are to be placed immediately next to the main CH feature. As such, in order to reduce the feature count in the mask, the 0-phase SBs can be eliminated from the mask design, and any effect resulting from their absence should be able to be compensated for by performing the subsequent model-based OPC. It is noted that the areas 101 of FIG. 10 indicate where transmitted light at zero phase shift enhances the imaging of the target contact, and areas 103 indicate where transmitted light at π-phase shift would enhance the imaging of the target contact. Thus, this process places zero phase shifted material in areas 101 and the background areas, and places π-phase shifted material in areas 103.

Figure 11:
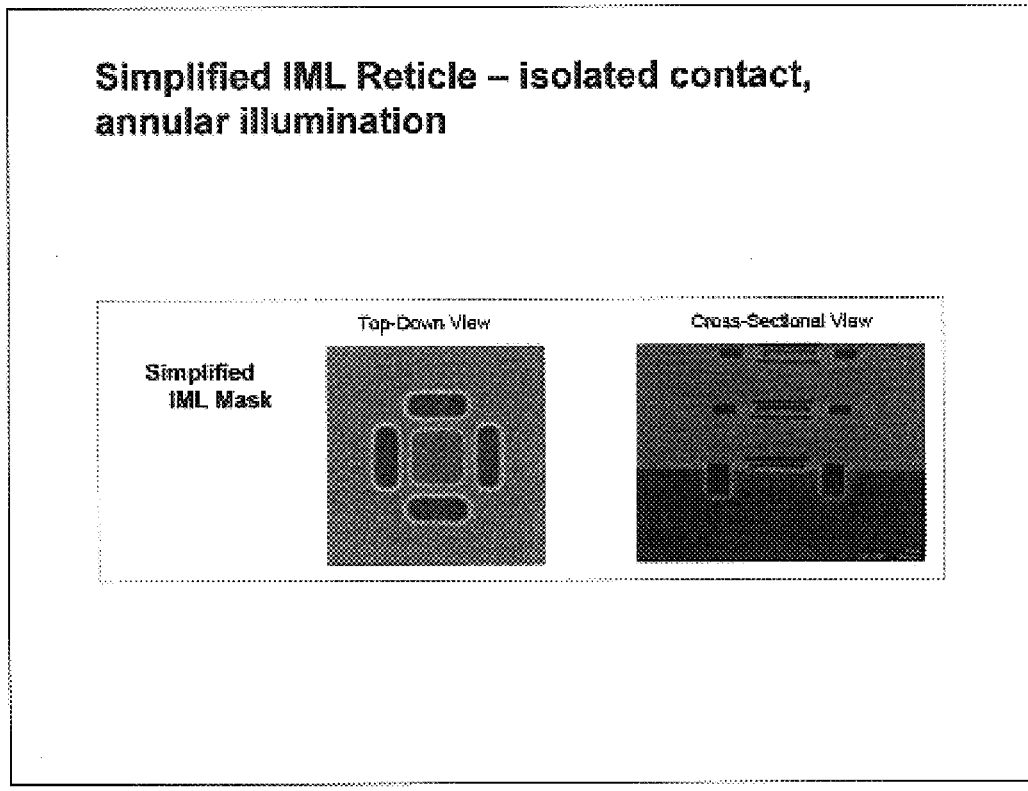
FIG. 11 illustrates SEM photos of an exemplary CPL mask formed in accordance with the present invention.

It is noted that the foregoing process can be applied to a CPL-type mask, where the π-phase shifted SB areas are etched into π-phase depth relative to the main CH pattern areas. The rest of areas can remain as chrome-covered, dark areas. However, to achieve a better peak intensity level, for the non-pattern areas, it is beneficial to cover such areas with non-phase-shifting attenuation film material having an adequate percent transmission (e.g., 6% transmission). FIG. 11 illustrates SEM photos of such an exemplary CPL mask type. FIG. 12a illustrates an example of a non-simplified mask pattern developed based on the IM, and FIG. 12b illustrates the simplified mask pattern generated by performing the foregoing process. As is shown in FIG. 12, the resulting mask pattern contains only π-phase SBs, and all SBs are the same size and shape. It is noted that by limiting the SB to one uniform size and shape further reduces the complexity of the final mask pattern. However, such SBs having an uniform size and shape may be connected together in a designated orientation to reduce overall feature count.

It is noted that the foregoing process can also be applied to illuminations other than the annular, such as, for example, but not limited to, Quasar and Cquad. FIGS. 13a and 13b illustrate the resulting IMs for a Quasar illumination and a Cquad illumination, respectively. As noted above, the first step in the process of applying the SBs is to determine the SB (e.g., the 0-phase shift SB or the π-phase shift SB) having the most effect on the imaging of the contact, and then utilize this SB in the mask design. It is interesting to note that the SB orientation can be different due to illumination such as Cquad vs. annular and Quasar as is shown for example FIGS. 13a and 13b. Additionally, the illumination utilized affects the background interference map, hence the optimum SB placement is different. Unlike annular, both Cquad and Quasar illumination types show that both 0-phase and π-phase SBs are present in the background area. However, in accordance with the given embodiment, only the π-phase SBs that are immediately next to the main contact feature pattern will be utilized in the mask design, as such a π-phase SB will likely have the most effect on the imaging of the contact hole. Attenuated material will be applied on the rest of non-patterning areas in the actual mask design. It is again noted that once the SBs are applied to the mask design, a model-based OPC process may be executed on the mask design.

As a variation to the foregoing, it is also feasible to select 0-phase SB instead of π-phase SB, and only utilize 0-phase SBs in the mask design. The 0-phase SBs that are most adjacent to the main contact feature will be identified and placed in the mask design. In the given example, the 0-phase SBs will have the same 0-phase as the main contact feature, and the remaining non-imaging areas can be covered by 0-phase, either with non-transparent chrome material or with attenuated material that is π phase-shifted. It is noted that this technique is more suitable for use with attenuated PSM with adequate percent transmission.

Turning to another embodiment of the invention, after a densely packed CH pattern has been decomposed into two exposure masks, and the foregoing IML-SB technique and model-based OPC has been performed, when applying double exposure methods for imaging contacts, the two exposures can result in SBs that are at the same location, which location therefore receives double the energy, and as a result, unwanted "resist dimple" can be printed on the wafer. However, by properly designing the IML reticle, printing of SB (or dimpling) can be minimized.

A first method for minimizing the printing of unwanted SB, is to place SB features for the first exposure at the same locations as target contacts in the second exposure. As a result, the energy will be substantially placed at a location where a contact is desired. Thus, the likelihood of such "dimpling" is minimized.

A second method for minimizing "dimpling" is to assign SB features in the second exposure mask in consideration of the SB features in the first exposure mask so as to assure that no SB feature is placed at the same location on both exposures. It is noted that if the respective IM for the two masks do not allow for non-overlapping SBs to be positioned in each mask, it is also possible to change the illumination setting for one of the exposures in an effort to shift the placement of the necessary SBs for the exposure so as to eliminate the overlapping of the SBs. In other words, it is possible to use two different illuminations for each exposure mask. For example, as shown in FIGS. 13a and 13b, the optimum $\pi$-phase SBs are oriented differently under different illumination, such as rectilinear $\pi$-phase SBs placement for Quasar illumination, and 45 and 135-degree $\pi$-phase SB placements for Cquad illumination. In the event that overlapping SB areas are unavoidable between the first and the second exposure masks, the SB overlapped area will need to be identified and minimized. An adequate model-based OPC can typically compensate for the overlapped SB effect in the given area.

As noted above, the method of the present invention provides important advantages over the prior art. Most importantly, the present invention provides a method for applying SBs which allows for the benefits associated with IM but which reduces the SB count and the overall complexity of the mask design.

Figure 14:
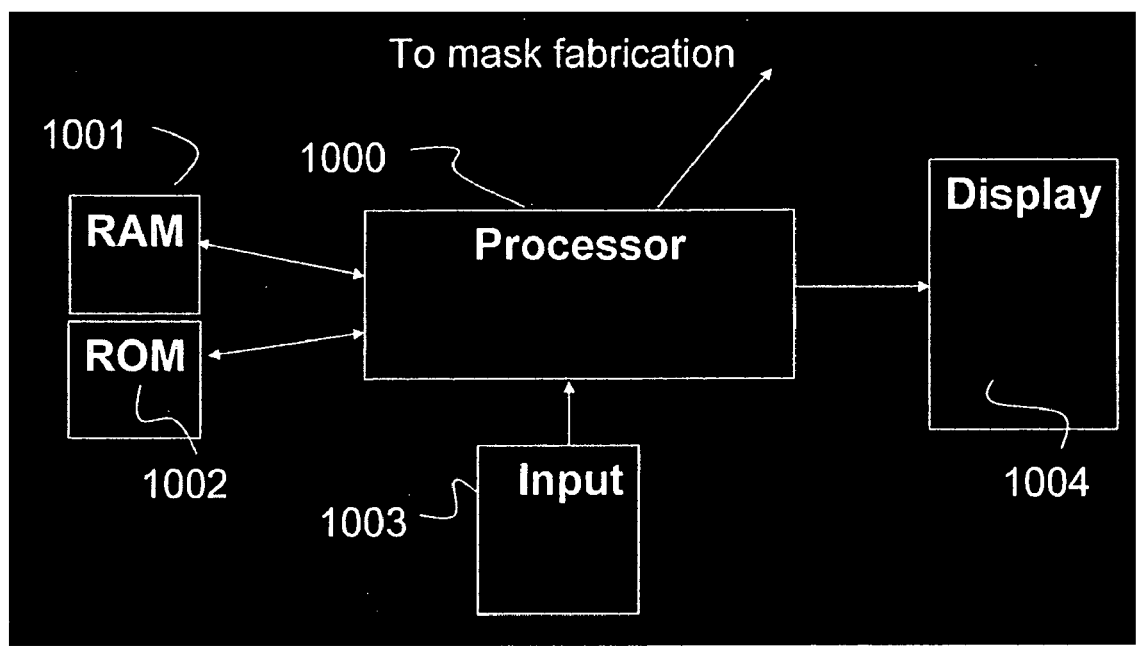
FIG. 14 illustrates an exemplary processing system for implementing the OPC method of the present invention.

FIG. 14 illustrates an exemplary processing system for implementing the mask design method of the present invention. As illustrated in FIG. 14, an exemplary processing system may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the methods detailed above for generating a mask layout in accordance with the present invention, and stores information on RAM 1001. The calculated results (e.g., mask design) of processor 1000 may be displayed on display 1004 and may be provided to a mask fabrication unit.

The software functionalities of such a computer system involve programming, including executable code, may be used to implement the above SB application method for placing scattering bars within a given target pattern. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 15:
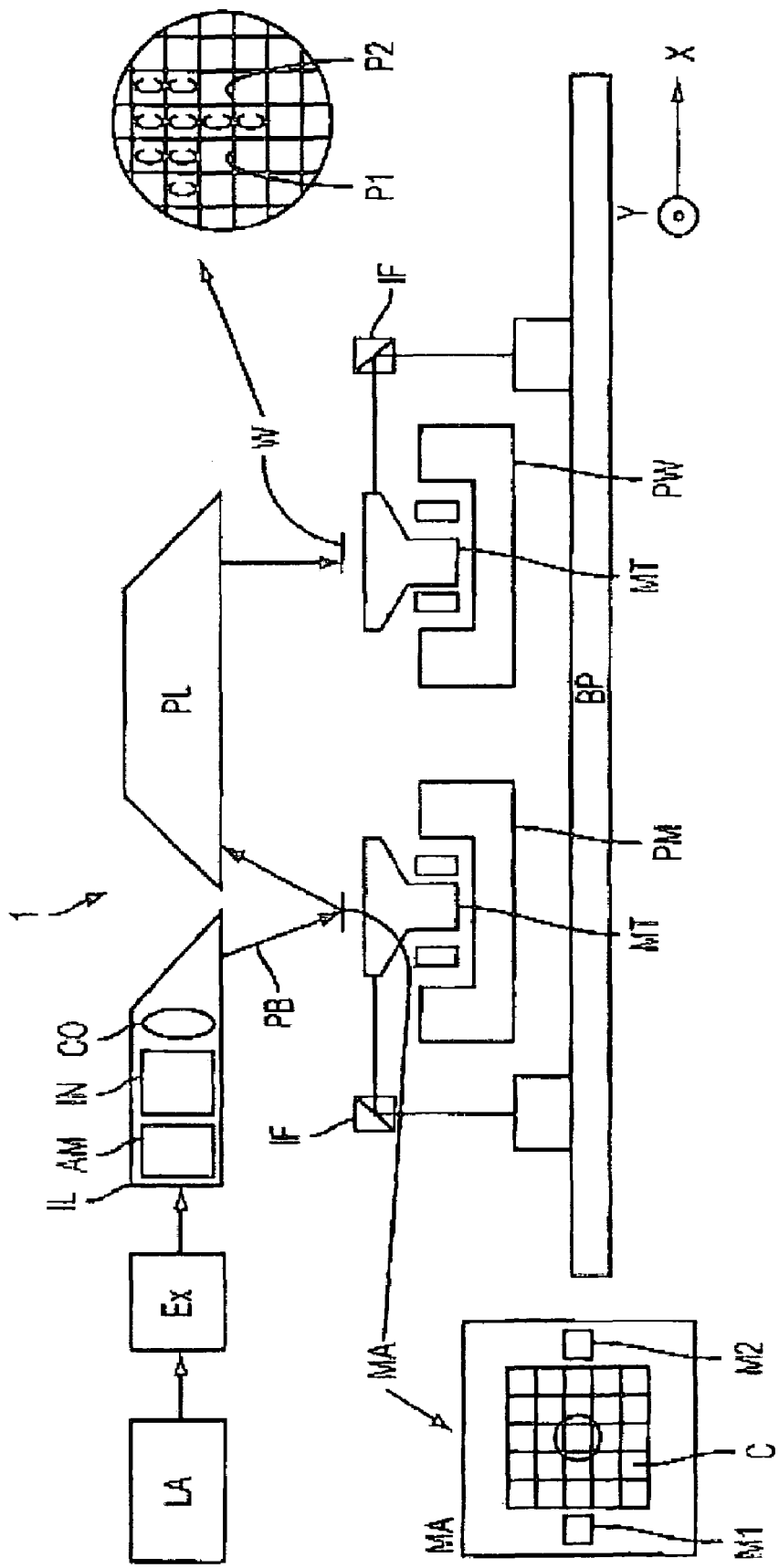
FIG. 15 schematically depicts a lithographic projection apparatus suitable for use with the masks designed with the aid of the current invention.

FIG. 15 schematically depicts a lithographic projection apparatus suitable for use with the masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 15 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of applying optical proximity correction features to a mask having a target pattern comprising a plurality of features to be imaged, said method comprising the steps of:

defining a set of process parameters to be utilized to image said mask;

determining an interference map based on said process parameters and said target pattern;

defining an area of influence which represents the area about a given feature in said target pattern in which scattering bars will be utilized in said mask; and disposing a scattering bar in said mask adjacent said given feature in a location indicated by said interference map, said disposing including determining whether said location is within said area of influence such that no scattering bar associated with said given feature is disposed outside said area of influence of said given feature.

2. The method of claim 1, further comprising the steps of:

defining an area of influence for each of said plurality of features; and disposing at least one scattering bar within said area of influence for a plurality of said plurality of features.

3. The method of claim 2, further comprising the step of performing a optical proximity correction process after said scattering bars have been disposed in said mask.

4. The method of claim 3, wherein said plurality of features comprises an array of contact holes.

5. The method of claim 3, wherein said plurality of features comprises randomly spaced contact holes.

6. The method of claim 2, further comprising the step of connecting adjacent scattering bars located within a given area of influence so as to form a single scattering bar, said single scattering being sub-resolution.

7. The method of claim 2, wherein said scattering bars disposed in said mask exhibit a π-phase shift relative to said given feature.

8. The method of claim 2, wherein said scattering bars disposed in said mask exhibit a 0-phase shift relative to said given feature.

9. A method of generating a mask having a target pattern comprising a plurality of features to be imaged and optical proximity correction features, said method comprising the steps of:

defining a set of process parameters to be utilized to image said mask;

determining an interference map based on said process parameters and said target pattern;

defining an area of influence which represents the area about a given feature in said target pattern in which scattering bars will be utilized in said mask; and disposing a scattering bar in said mask adjacent said given feature in a location indicated by said interference map, said disposing including determining whether said location is within said area of influence such that no scattering bar associated with said given feature is disposed outside said area of influence of said given feature.

10. The method of claim 9, further comprising the steps of:
defining an area of influence for each of said plurality of features; and
disposing at least one scattering bar within said area of influence for a plurality of said plurality of features.

11. The method of claim 10, further comprising the step of performing a optical proximity correction process after said scattering bars have been disposed in said mask.

12. The method of claim 11, wherein said plurality of features comprises an array of contact holes.

13. The method of claim 11, wherein said plurality of features comprises randomly spaced contact holes.

14. The method of claim 10, further comprising the step of connecting adjacent scattering bars located within a given area of influence so as to form a single scattering bar, said single scattering being sub-resolution.

15. The method of claim 10, wherein said scattering bars disposed in said mask exhibit a $\pi$-phase shift relative to said given feature.

16. The method of claim 10, wherein said scattering bars disposed in said mask exhibit a 0-phase shift relative to said given feature.

17. A computer program product for controlling a computer comprising a recording medium readable by the computer, means recorded on the recording medium for directing the computer to generate files corresponding to a mask having a target pattern comprising a plurality of features to be imaged and optical proximity correction features, said generation of said files comprising the steps of:

defining a set of process parameters to be utilized to image said mask;

determining an interference map based on said process parameters and said target pattern;

defining an area of influence which represents the area about a given feature in said target pattern in which scattering bars will be utilized in said mask; and disposing a scattering bar in said mask adjacent said given feature in a location indicated by said interference map, said disposing including determining whether said location is within said area of influence such that no scattering bar associated with said given feature is disposed outside said area of influence of said given feature.

18. The computer program product of claim 17, wherein said generation of said files further comprises the steps of:

defining an area of influence for each of said plurality of features; and disposing at least one scattering bar within said area of influence for a plurality of said plurality of features.

19. The computer program product of claim 18, wherein said generation of said files further comprises the step of performing a optical proximity correction process after said scattering bars have been disposed in said mask.

20. The computer program product of claim 19, wherein said plurality of features comprises an array of contact holes.

21. The computer program product of claim 19, wherein said plurality of features comprises randomly spaced contact holes.

22. The computer program product of claim 18, wherein said generation of said files further comprises the step of connecting adjacent scattering bars located within a given area of influence so as to form a single scattering bar, said single scattering being sub-resolution.

23. The computer program product of claim 18, wherein said scattering bars disposed in said mask exhibit a $\pi$-phase shift relative to said given feature.

24. The computer program product of claim 18, wherein said scattering bars disposed in said mask exhibit a 0-phase shift relative to said given feature.

25. A device manufacturing method comprising the steps of:

(a) providing a substrate that is at least partially covered by a layer of radiation-sensitive material;

(b) providing a projection beam of radiation using an imaging system;

(c) generating a mask having a plurality of feature, said mask utilized to endow the projection beam with a pattern in its cross-section;

(d) projecting the patterned beam of radiation onto a target portion of the layer of radiation-sensitive material, wherein, in step (c), said mask is formed by a method comprising the steps of:

defining a set of process parameters to be utilized to image said mask;

determining an interference map based on said process parameters and a target pattern;

defining an area of influence which represents the area about a given feature in said target pattern in which scattering bars will be utilized in said mask; and disposing a scattering bar in said mask adjacent said given feature in a location indicated by said interference map, said disposing including determining whether said location is within said area of influence such that no scattering bar associated with said given feature is disposed outside said area of influence of said given feature.

* * * * *